United States Patent [19]

Bader et al.

[11] Patent Number: 4,493,137
[45] Date of Patent: Jan. 15, 1985

[54] METHOD OF MAKING A DRIVE ELEMENT ASSEMBLY FOR INK JET PRINTING

[75] Inventors: Leonhard Bader, Stadtbergen; Ferdinand Hermann, Neuaess; Wilhelm Ruprich; Hermann Winter, both of Augsburg, all of Fed. Rep. of Germany

[73] Assignee: NCR Corporation, Dayton, Ohio

[21] Appl. No.: 533,399

[22] Filed: Sep. 19, 1983

[51] Int. Cl.³ .............................................. H04R 17/00
[52] U.S. Cl. .................................. 29/25.35; 346/1.1; 346/140 R
[58] Field of Search ...................... 29/25.35, 840, 832, 29/837, 839, 843, 865, 866, 25.42; 310/328, 369; 346/140 R, 1.1

[56] References Cited

U.S. PATENT DOCUMENTS

| 3,298,030 | 1/1967 | Lewis et al. | 346/75 |
|---|---|---|---|
| 3,397,345 | 8/1968 | Dunlavey | 346/75 |
| 3,416,207 | 12/1968 | Maida | 29/25.42 |
| 4,021,818 | 5/1977 | Van Vloten | 346/140 |
| 4,095,238 | 6/1978 | Kattner et al. | 346/140 |
| 4,158,847 | 6/1979 | Heinzl et al. | 346/140 |
| 4,180,225 | 12/1979 | Yamada | 346/75 |
| 4,272,200 | 6/1981 | Hehl | 310/328 |
| 4,288,799 | 9/1981 | Uzawa et al. | 346/140 |
| 4,308,546 | 12/1981 | Halasz | 346/140 |
| 4,314,393 | 2/1982 | Wakatsuki et al. | 29/25.35 |
| 4,323,908 | 4/1982 | Lee et al. | 346/140 |

FOREIGN PATENT DOCUMENTS

| 49272 | 4/1980 | Japan | 346/140 R |
|---|---|---|---|
| 71572 | 5/1980 | Japan | 346/140 R |
| 67480 | 5/1980 | Japan | 346/140 |

Primary Examiner—Howard N. Goldberg
Assistant Examiner—P. W. Echols
Attorney, Agent, or Firm—J. T. Cavender; Stephen F. Jewett; Robert L. Clark

[57] ABSTRACT

Described is a piezoelectric drive element assembly for use in ink jet printer devices. The assembly comprises a piezoelectric drive element, which is characterized by a pair of electrodes spaced apart and thereby electrically isolated from one another on an external lateral face of the drive element. The assembly further includes a printed circuit board having holes through which the drive element is fitted, with the electrodes of the drive element being soldered to opposite sides of the printed circuit board.

5 Claims, 4 Drawing Figures

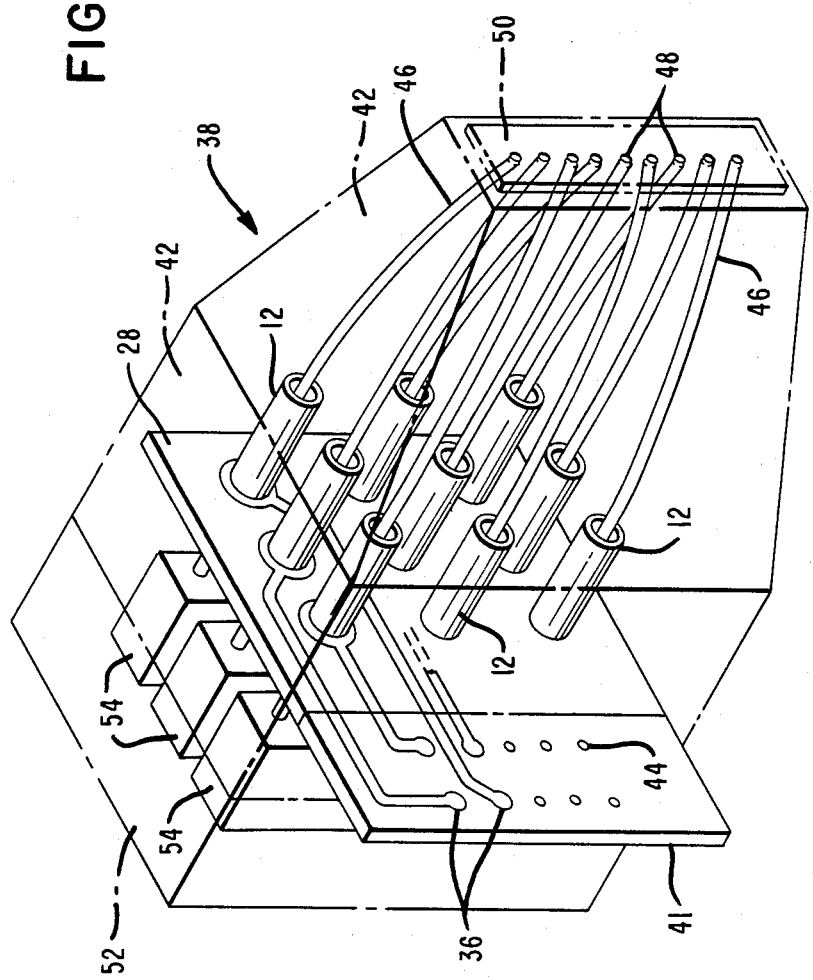

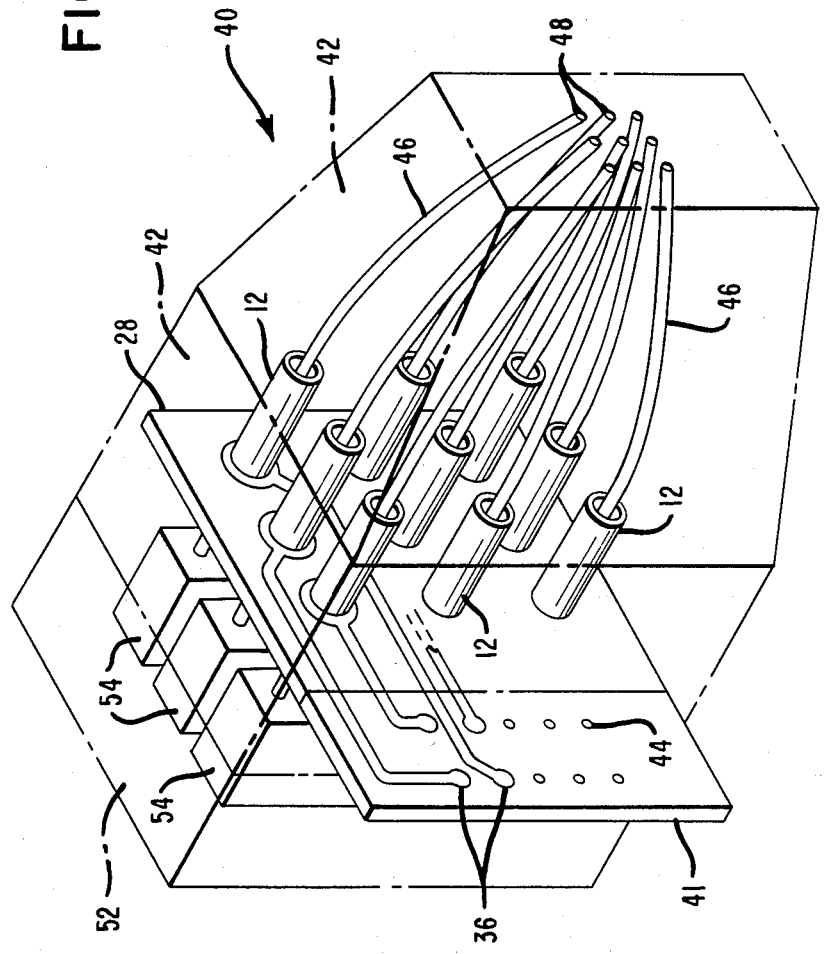

METHOD OF MAKING A DRIVE ELEMENT ASSEMBLY FOR INK JET PRINTING

BACKGROUND OF THE INVENTION

This invention relates to ink jet printer devices, including devices which are sometimes called ink-operated mosaic printer devices. More particularly, this invention relates to the piezoelectric drive element assemblies which are commonly used in such devices.

An ink jet printing, droplets of printing liquid or ink are ejected onto paper or other record media by piezoelectric contraction of drive elements which form or surround passages through which the printing liquid flows. A typical drive element comprises a hollow body, such as a piezoceramic tube having external and internal cylindric lateral faces. These faces can be coated or otherwise combined with metal or other conductive material to provide a pair of electrodes for operating the drive element. Upon application of an electrical signal or pulse across the electrodes, as by means of a conventional character generator circuit, there is a mechanical contraction of the piezoceramic tube and this contraction is transmitted to the ink to cause ejection of an ink droplet onto the record media.

Background relating to known piezoelectric drive elements is contained in U.S. Pat. Nos. 3,298,030; 4,158,847; 4,288,799 and 4,323,908; and these U.S. patents are hereby incorporated herein by reference.

The piezoelectric drive elements are normally components of a print head assembly which, for different constructions, can be either stationary or movable with respect to the printer device. A print head assembly can comprise a single piezoelectric drive element or it can comprise multiple elements. Multiple elements can be arranged in a column, in a row or in an array consisting of columns and rows. For example, in printing in variable colors, it is particularly convenient to utilize a movable print head comprising multiple piezoelectric drive elements which are arranged in an array.

By way of illustration, a print head having multiple drive elements may be supplied with three inks each of a different primary color, and a separate column of drive elements may be used for each ink. With such a print head, alphanumeric characters in seven different colors can be printed in a matrix pattern of ink dots. The color of each dot, and therefore the color of each character, would be determined either by using one of the three inks, or by using a combination of two or three of those inks. Combining the inks can produce four additional colors which can be obtained by means of successive passes of the ink jet print head relative to the paper or other record media.

In movable ink jet print heads, which comprise multiple piezoelectric drive elements, it is known to supply the ink by means of reservoirs which are made a part of the print head assembly. The reservoirs will normally maintain the ink supplies as narrow vertical columns of ink which are arranged perpendicular to the direction of the print head movement during printing. The reservoirs are thus constructed to minimize the formation of pressure waves in the ink supply which may be induced by nonuniform movement of the print head. In one known color ink jet print head, as disclosed in German Pat. No. DE/PS 2925812, which is hereby incorporated herein by reference, an example is given of a movable print head comprising three ink supply reservoirs which are arranged in a row for color ink jet printing.

To achieve high rates of printing, as expressed in characters per second, or lines per minute, movable print heads are subjected to high rates of acceleration and deceleration during the printing process. It is accordingly desirable to minimize the mass of movable print heads, in order to minimize the forces necessary to be exerted upon the print heads for high rates of printing.

It is known to produce movable print heads of low mass by casting an epoxy or other suitable resin in a mold. Before the resin is cast, the piezoelectric drive elements are supported within the mold cavity by means of corresponding pins which are part of the mold. The drive elements are slipped onto these pins, and the resin is cast and allowed to harden. The pins are then withdrawn from the resultant cast body, leaving the channels or passages through which the ink is to pass for ejection. This is a known construction method which provides in situ casting of the piezoelectric drive elements in the cast print head while forming passages for the flow of ink which is to be ejected. This method has been disclosed in U.S. Pat. Nos. 4,095,238 and 4,158,847 which are hereby incorporated herein by reference for informational purposes.

In the manufacture of print heads of all types and configurations for ink jet printing, it is desirable to provide a secure and simplified means by which electrical connections are made to the electrodes of the piezoelectric drive elements. It is also desirable to provide a simplified means by which the piezoelectric drive elements can be accurately arranged and mechanically secured within the print head unit, whether the unit be formed by casting or some other process.

SUMMARY OF THE INVENTION

This invention provides a special piezoelectric drive element assembly for use in a print head to be used in an ink jet printer device. This assembly includes at least one piezoelectric drive element, which comprises a hollow body made of a piezoelectric material, and a pair of electrodes which are spaced apart and thereby electrically isolated from one another on an external lateral face of the hollow body. The drive element is fitted through a hole in a printed circuit board, which is a part of the assembly, and the drive element electrodes are respectively soldered to opposite sides of the printed circuit board.

The invention has the advantage of providing a simplified means by which electrical connections are made to the electrodes of each piezoelectric drive element to be used in a print head. By using the printed circuit board, the board can conveniently be fitted with an electrical connector having terminals which are connected to the electrodes of the piezoelectric drive element by electrical runs which are printed on the circuit board.

Another advantage of the invention is that the printed circuit board provides a chassis on which the piezoelectric drive elements can be accurately positioned and mechanically secured.

The piezoelectric drive element assembly of this invention can, if desired, be cast in situ in synthetic resin or other suitable material, to provide a print head having low mass. In a process for making such a print head, pins are used, according to convention, as part of the mold, to provide passages for the flow of ink. The positioning of the piezoelectric drive elements is facilitated by having the drive elements fixed to the circuit board when the pins are inserted.

As will be illustrated by a description of the presently preferred embodiment of the invention, the piezoelectric drive element assembly may comprise multiple drive elements, which can be arranged in an array, for use in a cast movable print head for color ink jet printing.

It is therefore an object of this invention that the piezoelectric drive elements be accurately positioned and securely mounted to a chassis, while at the same time reliable electrical contacts are established with the electrodes of the piezoelectric drive elements, to provide an assembly which can readily be tested before its inclusion in a print head.

It is another object of this invention to provide simplified means for connecting electrical circuitry, such as character generator control circuitry, to the electrodes of the piezoelectric drive elements to be used in the print head.

BRIEF DESCRIPTION OF THE DRAWINGS

FIG. 2 is a perspective, transparent view of a color ink jet print head with nine ink channel nozzles arranged in a single row, making use of a piezoelectric drive element assembly in accordance with a presently preferred embodiment of this invention.

FIG. 3 is a perspective, transparent view of a color ink jet print head with nine ink channel nozzles arranged to a three by three matrix, making use of the piezoelectric drive element assembly depicted in FIG. 2.

DETAILED DESCRIPTION OF THE PRESENTLY PREFERRED EMBODIMENTS

Figure 1:
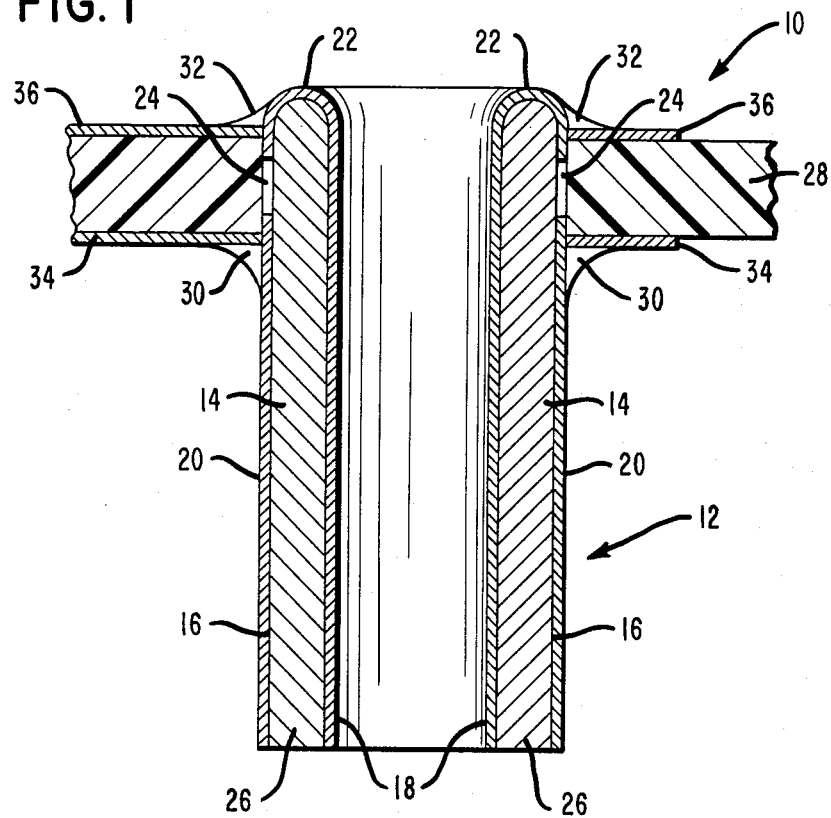
FIG. 1 is a cross-sectional view of a printed circuit board with a tubular piezoelectric drive element mounted thereon, showing the electrical connections of the drive element electrodes to conductors on the printed circuit board in accordance with this invention.

FIG. 1 illustrates a piezoelectric drive element assembly 10 in accordance with the presently preferred embodiment of this invention, for use in an ink jet printer device. The assembly 10 includes a cylindrical piezoelectric drive element 12, composed of a hollow ceramic body 14 which is open at opposite ends. While a cylindrical shape is illustrated, the exact shape is not critical for purposes of this invention.

The body 14 has an external lateral face 16 and an internal lateral face 18, which may be cylindrical faces as illustrated in FIG. 1. The internal lateral face 18 is seen to provide a structure through which printing liquid or ink may be caused to flow by piezoelectric contraction of the hollow body 14.

The drive element 12 illustrated in FIG. 1 has a pair of electrodes 20 and 22 which are separated by an annular gap 24 on the external lateral face 16 and by an annular gap 26 on the bottom end (as viewed in FIG. 1) of the drive element 12. The electrodes 20 and 22 are thus electrically isolated from one another.

Electrodes 20 and 22 can be provided in a simple way by first completely coating hollow body 14 with metal by vapor-deposition process. The hollow body 14 can thus be metalized using known methods to provide the hollow body 14 with a conductive coating. The coating may, for example, consist of a stoved silver finish mixed with glass solder so that the coating will be electrically conductive and at the same time impermeable by ink. By subsequent grinding operations, the conductive coating can be selectively removed from the hollow body 14 so as to provide the gaps 24 and 26 which space apart and electrically isolate the electrodes 20 and 22.

Hence, in accordance with the presently preferred embodiment of this invention, an electrically conductive coating is applied to the external and internal lateral faces 16 and 18 of the hollow body 14, and the coating is discontinuous on a portion of the external face 16 proximate to one end of the hollow body 14, so as to define a band around the circumference of the hollow body 14 on which the coating is not present. The coating thus forms the pair of electrodes 20 and 22 for the drive element 12, and the electrodes 20 and 22 are spaced apart by the gap 24 defined by the band just described. The electrodes 20 and 22 are also spaced apart by the gap 26, the location of which is not critical for purposes of this invention.

The drive element 12 may be fitted around a glass tube as described in U.S. Pat. No. 3,298,030; or it may be fitted around an ink-impermeable electrically conductive metal tube as described in U.S. Pat. No. 4,158,847; or such tubes may be omitted as illustrated in the appended drawings.

As shown in FIG. 1, the assembly 10 further includes a printed circuit board 28 having a hole through which the drive element 12 is fitted. As illustrated, the electrodes 20 and 22 are respectively soldered to opposite sides of the printed circuit board 28, at locations 30 and 32. There is a first electrical run 34 on one side of the printed circuit board 28, and the run 34 is soldered to the electrode 20 at the location 30. There is a second electrical run 36 on the opposite side of the circuit board 28, and the run 36 is soldered to the electrode 22 at the location 32.

It can thus be seen, in accordance with this invention, that electrical contacts of the electrodes 20 and 22 to the electrical runs 34 and 36 are provided by conductive solder joints at the respective locations 30 and 32, and these joints serve as an adhesive for fixing the piezoelectric drive element 12 to the printed circuit board 28.

For purposes of illustrating the use of the presently preferred embodiment of the invention, reference is made to FIGS. 2 and 3, which respectively illustrate ink jet print heads 38 and 40 each capable of printing in seven different colors by means of nine ink channels. The print heads 38 and 40 are essentially identical, except for the nozzle arrangements which are depicted.

In each of the FIGS. 2 and 3, there is illustrated a piezoelectric drive element assembly 10 comprising nine tubular piezoelectric drive elements 12 mounted in parallel on a printed circuit board 28 in a three-by-three matrix arrangement within a print head block 42. Nine separate electrical runs 34 are respectively connected to the outer electrodes 20 of the nine drive elements 12, and the electrical runs 34 each terminate on one end 41 of the printed circuit board 28 for connection with an electrical connector (not shown) on the outside of print head block 42. One electrical run 36 (as seen in FIG. 1, but not shown in the other drawings) commonly connects all nine inner electrodes 22 of the nine drive elements 12 with a tenth connector terminal at 44 outside the print head block 42.

In the construction of the print heads 38 and 40, the nine drive elements 12 are fitted to the printed circuit board 28 and the respective electrodes 20 and 22 are electrically connected to the printed circuit board 28 in the manner illustrated in FIG. 1. An electrical connector such as a socket or a plug is connected to the printed circuit board 28, at the circuit board end 41, and then the assembly is electrically tested. The tested assembly can then be cast in resin in a print head mold. The nine ink channels 46 are made by inserting suitably bent pins through the respective drive elements 12, and the pins are held in position at the face of the print head to coincide with the nozzles 48 of the nozzle plate 50 (shown in FIGS. 2 and 4), where the nozzles 48 are arranged in a straight line configuration as shown in FIG. 2, or in a three-by-three matrix configuration as shown in FIG. 3. (In FIG. 3 the nozzle plate 50 is not shown in order to better indicate the constant curvature bending of the ink channels 46 toward the face of the print head 40.)

Each of the print heads 38 and 40 are fitted with an ink manifold module 52 which contains three compartments 54 for inks of the three primary colors, i.e., magenta red, yellow, and cyan blue. The ink manifold module 52 is attached to the print head block 42, as shown in FIGS. 2 and 3, by means of machine screws (not shown). The attachment is leakproof as the mating surfaces of the print head block 42 and the manifold module 52 are polished and lapped prior to assembly. Each of the three compartments 54 communicates respectively with the three ink channels of each vertical column of channels 46 in the print heads 38 and 40.

Colored ink in each of the three manifold compartments 54 can easily be replenished by ink flowing through flexible tubing 60 (shown in FIG. 4) from a main supply reservoir (not shown) running to the compartments 54.

Figure 4:
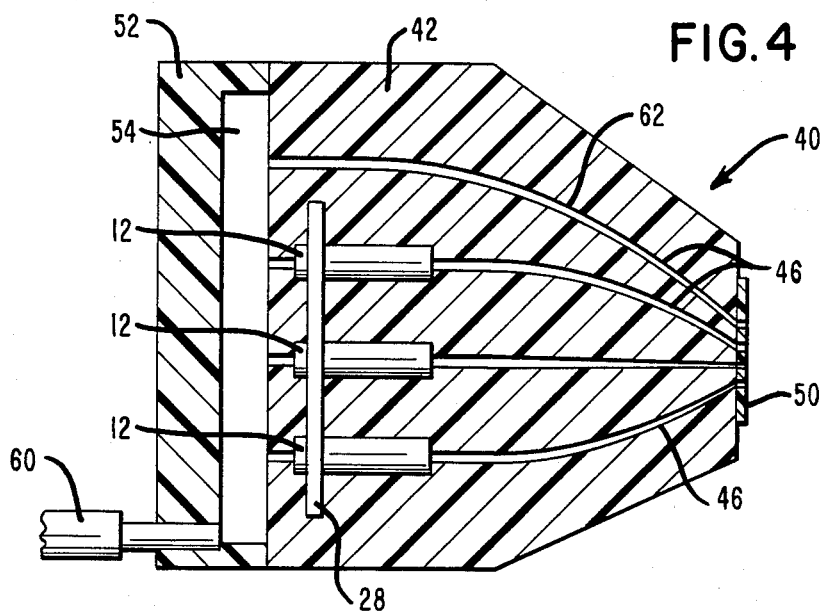
FIG. 4 is a cross-sectional view of a cast ink jet print head as shown in FIG. 3, where the print head has a deaereating channel.

FIG. 4 illustrates a cross-section taken through the central ink supply channel column and manifold compartment 54 of a print head configuration of the type shown in FIG. 3. FIG. 4 illustrates employment of a deaereating channel 62 (not shown in the other drawings) associated with the central ink supply channel column. Each of the other two ink supply channel columns can be similarly supplied with a deaereating channel 62, identical to the one shown in FIG. 4, for the purpose of deaereating the ink and maintaining a slight underpressure for each color ink supply system. Deaereating channels are described in U.S. Pat. No. 4,126,868 which is hereby incorporated herein by reference for informational purposes. Means for deaereating and maintaining a slight ink supply system under pressure can be implemented in a similar manner in a print head with nine nozzles in a vertical row, such as the print head 38.

The illustrated print heads 38 and 40 are especially adapted to be made by a casting process to result in print heads having a low mass. Thus, the print heads 38 and 40 can be advantageously used as movable print heads, so as to be moved in a linear fashion across a sheet of paper or other record media by means of a conventional mechanism (not shown) while at the same time being driven in a character-dependent fashion by means of a conventional character generator circuit (not shown).

While preferred embodiments of this invention have been described in some detail, it will be understood that the invention may be embodied in other forms. This invention is defined and limited only by the scope of the following claims.

What is claimed is:

1. A method of making a print head for use in an ink jet printer device, which comprises the following steps:
   (a) providing a piezoelectric drive element, comprising a hollow body made of a piezoelectric material, and a pair of electrodes spaced apart and thereby electrically isolated from one another on an external face of said hollow body;
   (b) fitting said piezoelectric drive element through a hole in a printed circuit board, so that a portion of said hollow body extends through said hole and the space between said electrodes on said face is between the opposite sides of said circuit board; and
   (c) respectively soldering said electrodes to opposite sides of said circuit board.

2. The method of claim 1 which further comprises the step of casting said printed circuit board with said electrodes soldered to the opposite sides thereof, in a casting mold, to produce a cast block for said print head which comprises a channel for the flow of ink from said piezoelectric drive element.

3. The method of claim 2, wherein prior to the casting step set forth in claim 7, said piezoelectric drive element is electrically tested in situ with its electrodes soldered to the opposite sides of said printed circuit board.

4. A method of making a piezoelectric drive element assembly for use in an ink jet printer device, where said method comprises the following steps:
   (a) providing a piezoelectric drive element, comprising: a hollow body made of a piezoelectric material, said hollow body being open at opposite ends and having an external lateral face and internal lateral face; an electrically conductive coating on said external and internal faces of said hollow body, said coating being discontinuous on a portion of said external lateral face approximate to one end of said hollow body so as to define a band around the circumference of said hollow body on which said coating is not present, said coating forming a pair of electrodes for said drive element, and said electrodes being spaced apart by a gap defined by said band;
   (b) fitting said piezoelectric drive element through a hole in a printed circuit board, so that said one end of said hollow body extends through said hole, and said gap is between the opposite sides of said circuit board; and
   (c) respectively soldering said electrodes to opposite sides of said circuit board.

5. A method of making a piezoelectric drive element assembly for use in an ink jet printer device by which droplets of printing liquid are ejected by piezoelectric contraction of a drive element which forms or surrounds a passage through which the printing liquid may flow where said method comprises the following steps:
   (a) providing a piezoelectric drive element, comprising: a hollow body made of a piezoelectric material and having external and internal lateral faces; a first electrode on the external face of said hollow body; and a second electrode on the internal lateral face of said hollow body, on one end of said hollow body and on a portion of the external lateral face of said hollow body approximate to said one end; said first and second electrodes being separated by a gap on said external lateral face;
   (b) fitting said piezoelectric drive element through a hole in a printed circuit board, so that said one end of said hollow body extends through said hole and said gap is between the opposite sides of said circuit board; and
   (c) respectively soldering said electrodes to opposite sides of said circuit board.

* * * * *